(12) United States Patent  
Nehr et al.

(10) Patent No.: US 7,186,591 B2  
(45) Date of Patent: Mar. 6, 2007

(54) METHOD OF ENCAPSULATING AN ASSEMBLY WITH A LOW TEMPERATURE SILICONE RUBBER COMPOUND

(75) Inventors: Lance T. Nehr, Ramsey, NJ (US); Leon L. Vail, Hallstead, PA (US); Patricia C. Tarr, Franklin Lakes, NJ (US); Daniel McAlister, East Stroudsburg, PA (US)

(73) Assignee: Honeywell International, Inc., Morristown, NJ (US)

( * ) Notice: Subject to any disclaimer, the term of this patent is extended or adjusted under 35 U.S.C. 154(b) by 70 days.

(21) Appl. No.: 11/165,230

(22) Filed: Jun. 24, 2005

(65) Prior Publication Data

US 2006/0292881 A1    Dec. 28, 2006

(51) Int. Cl.  
*H01L 21/48* (2006.01)
(52) U.S. Cl. ............... 438/127; 257/791; 257/E21.449; 174/52.4; 174/E23.116
(58) Field of Classification Search ................ 438/55, 438/64, 112, 124, 126, 127, 906; 257/787, 257/788, 791; 427/374, 493, 519; 174/52.4  
See application file for complete search history.

(56) References Cited

U.S. PATENT DOCUMENTS 6,987,058 B2 *  1/2006  Hall ........................... 438/617

* cited by examiner

*Primary Examiner*—Quoc Hoang  
(74) *Attorney, Agent, or Firm*—Ingrassia Fisher & Lorenz

(57) ABSTRACT

A method for encapsulating an assembly with a methyl phenyl silicone rubber compound is provided. In various embodiments, the method can include exposing the assembly to a solvent, plasma etching the assembly, and producing a potting mixture, wherein the potting mixture comprises a methyl phenyl room temperature vulcanization silicone and a curing agent. The method can further include pouring the potting mixture over the assembly while under a vacuum until the assembly is encapsulated, pouring at least two control samples of the potting mixture while under the vacuum, curing the encapsulated assembly and the control samples in a first environment and monitoring the one of the control samples for hardness, and determining whether additional cure time in the first environment is needed based upon the results of the control sample hardness tests.

20 Claims, 3 Drawing Sheets

METHOD OF ENCAPSULATING AN ASSEMBLY WITH A LOW TEMPERATURE SILICONE RUBBER COMPOUND

FIELD OF THE INVENTION

The subject matter of this application relates to the encapsulation of an assembly. More particularly, the subject matter of this application relates to the use of a methyl phenyl room temperature vulcanization silicone compound as a potting mixture to encapsulate an assembly.

BACKGROUND OF THE INVENTION

Electronic circuits are often encapsulated in a polymer material to protect the circuit from damage. A typical example of an electronic circuit is a common computer chip encapsulated before being mounted to a circuit board. Among other things, the encapsulation protects the chip from weather damage, electric charge, and dirt. Typical electronic circuits that are encapsulated are relatively small, having dimensions, for example, of about 1"×½"×⅛". Further, typical encapsulated electronic circuits operate at most at a few hundred volts.

Encapsulating the electronic circuit is often accomplished by various known techniques, including flowing a mixture of an encapsulation material combined with a curing agent over the electronic circuit and allowing the mixture to solidify. By itself, the encapsulation material remains liquid. The curing agent is added to foster a chemical reaction that makes the mixture harden. The hardening process happens in a relatively short period of time. Because the electronic circuit is small, the mixture does not harden in the time it takes to cover all areas of the circuit. Because the electronic circuit operates at relatively low voltages, variations in the electrical material properties of the encapsulation material are acceptable.

Problems arise in the encapsulation process, however, when the electronic circuit is large and/or when the electronic circuit operates at very high electric fields. Some examples where problems arise are high voltage devices, such as power supplies, that operate at many tens of thousands of volts and comprise multiple electronic circuits and devices all packaged together to form an assembly. In these cases, encapsulation becomes critical. In particular, the encapsulation material must be able to withstand the high voltages to which the assembly is exposed. Also, the solidified encapsulating material should be free of voids and air bubbles in order to sustain such high voltages. Variations in the material properties become unacceptable as this can cause catastrophic failure to the assembly and the surrounding components.

Moreover, manufacturers do not make silicone encapsulation materials capable of flowing long enough to accurately cover large structures such as a 6" by 4" by 2.5" assembly mounted in a potting enclosure. Other encapsulation materials, such as epoxies and urethanes, etc. may provide ample flow time. However, each material has its own limitations, such as hardness and/or dielectric strength that can make them unacceptable for encapsulating large structures, such as electronic circuits, that operate at very high electric fields. As such, design engineers are forced to choose which limitations to accept. In the case of conventional silicone encapsulation materials, one problem is that the curing agent causes the mixture to have improper flow characteristics or harden long before large assemblies can be accurately and completely encapsulated. Typically what happens when attempting to encapsulate a large assembly is that the mixture covers only a part of the assembly before loosing its flowability, which can create voids and trap air bubbles. The remaining portion of the assembly is either not encapsulated or the material properties of the encapuslant have large variations throughout.

In the past, the amount of curing agent has been adjusted in an attempt to extend the flow time of the mixture. However, this has not solved the problems associated with variations in the material properties of the encapsulation material.

Problems with variations are exacerbated when the assembly is used in extreme conditions, such as onboard aircraft and marine craft. In the case of aircraft, the assembly can be exposed to extreme temperature, pressure, and moisture conditions. Combining these conditions with a high voltage device leads to unacceptable encapsulations schemes.

Thus, there is a need for a method and a material to encapsulate an assembly and, during the curing process, determine the dielectric strength of the silicone so as to adjust the curing process accordingly and provide for the required dielectric strength.

SUMMARY OF THE INVENTION

A method for encapsulating an assembly with a methyl phenyl silicone rubber compound is provided. In various embodiments, the method can include exposing the assembly to a solvent, plasma etching the assembly, and producing a potting mixture, wherein the potting mixture comprises a methyl phenyl room temperature vulcanization silicone and a curing agent. The method can further include pouring the potting mixture over the assembly while under a vacuum until the assembly is encapsulated, pouring at least two control samples of the potting mixture while under the vacuum, curing the encapsulated assembly and the control samples in a first environment and monitoring one of the control samples for hardness, and determining whether additional cure time in the first environment is needed based upon the results of the control sample hardness tests.

According to another embodiment of the invention there is also provided a method for encapsulating an assembly with a silicone rubber compound, the method comprising cleaning an assembly in a solvent, plasma etching the assembly with an oxygen plasma, and exposing the assembly to a primer solvent. The method also comprises producing a potting mixture, wherein the potting mixture comprises a methyl phenyl room temperature vulcanization silicone and a curing agent, pouring the potting mixture over the assembly while under a vacuum having an absolute pressure from about 3 mm of mercury to about 15 mm of mercury, curing the encapsulated assembly in a first environment and then baking the encapsulated assembly.

According to still other embodiments of the invention there is also provided an encapsulated assembly made according to a method comprising cleaning an assembly in a solvent, plasma etching the assembly with an oxygen plasma, and exposing the assembly to a primer solvent. The method used to make the encapsulated assembly also comprises producing a potting mixture, wherein the potting mixture comprises a methyl phenyl room temperature vulcanization silicone and a curing agent, pouring the potting mixture over the assembly while under a vacuum having an absolute pressure from about 3 mm of mercury to about 15 mm of mercury, curing the encapsulated assembly in a first environment and then baking the encapsulated assembly.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, not to be taken in a limited sense.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

As used herein, the term assembly is understood to mean an electronic device, such as a high voltage power supply, comprising a printed wiring board with attached electrical components. An assembly typically has an encapsulated volume of at least about 50 cubic inches.

As used herein, the term assembly housing is understood to mean a mechanical shell that acts as a mold to contain the assembly and the potting material during the encapsulation process.

As used herein, the term unit is understood to mean an assembly that has been installed into an assembly housing and has been encapsulated by a cured potting mixture.

FIGS. 1–5 depict exemplary methods and devices for encapsulating an assembly. According to various embodiments, a method for encapsulating an assembly in a silicone compound is provided. For ease of understanding, the method will be described using an assembly 100 depicted in FIG. 1. One of ordinary skill in the art will understand, however, that the disclosed method can be used with various assemblies.

Figure 2:
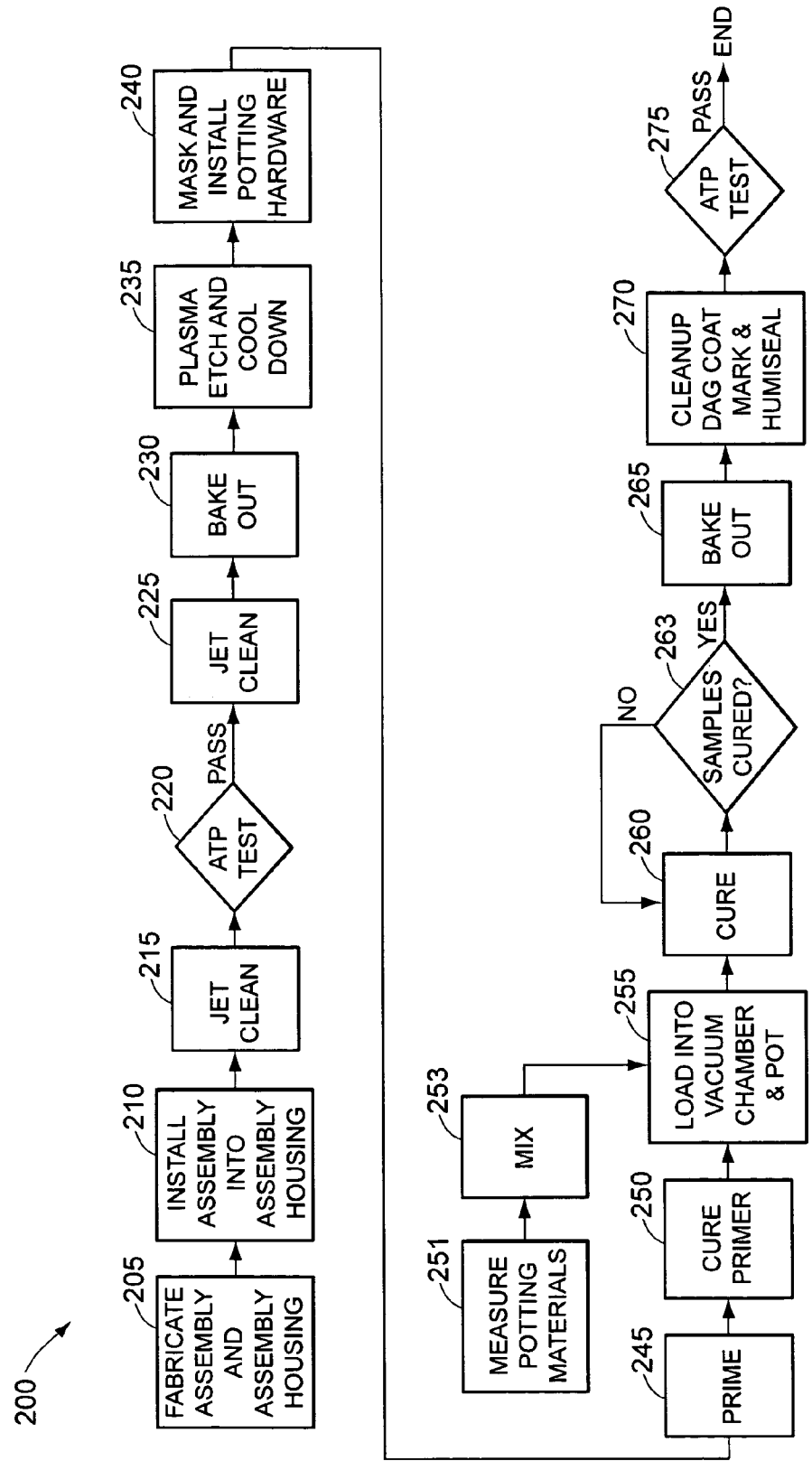
FIG. 2 depicts an exemplary flow chart for encapsulating an assembly according to various embodiments of the invention.
Figure 3:
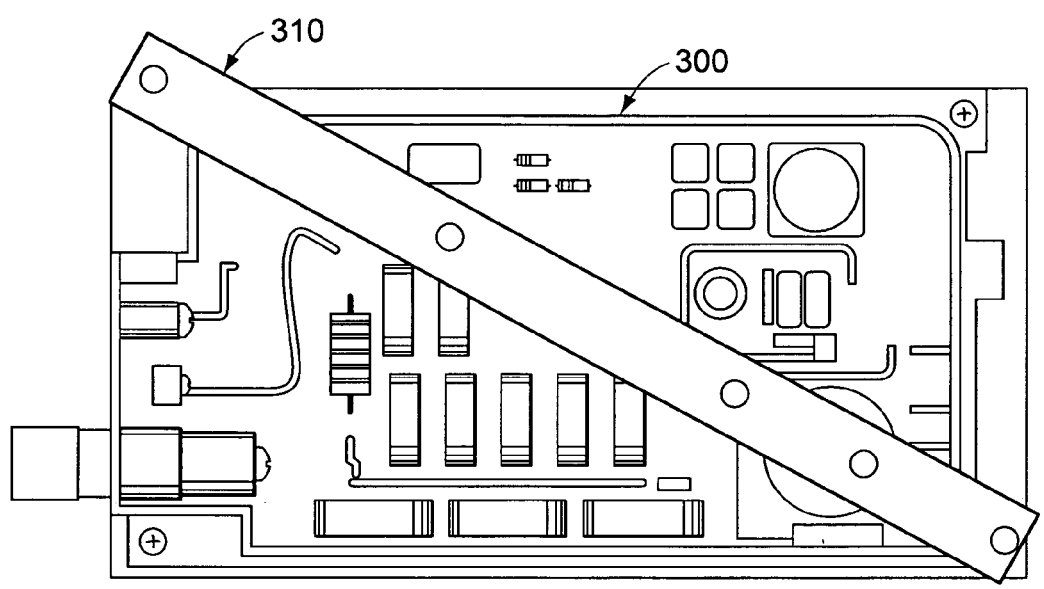
FIG. 3 depicts an exemplary assembly during an encapsulation process according to various embodiments of the invention.

FIG. 2 depicts an exemplary flow chart 200 that describes a method for encapsulating an assembly, such as assembly 100, according to various embodiments of the invention. For example, at 205, an assembly 100 and an assembly housing can be fabricated. At 210 the assembly can be positioned and installed into the assembly housing. Prior to encapsulation, the assembly can be cleaned using a series of cleaning steps. For example, at 215, flux, dirt, oils, and other contaminants can be removed from the assembly through mechanical agitation and exposure to a cleaning solvent in a cleaning tank. A JetClean system made by General Electric is an exemplary device for performing this cleaning step. Exemplary solvents used in the JetClean system include a 50/50 mixture of isopropyl alcohol (IPA) and EC7M cleaning solution, which is a non-fluorocarbon, environmentally-friendly-electronic cleaning terpene made by Petroferm, Inc.

After an initial clean, an Acceptance Test Procedure (ATP) can be conducted on the assembly, as shown at 220. The ATP can electrically test the assembly for proper electrical functionality. Upon completion of the ATP, the assembly can again be cleaned in a cleaning tank, such as the JetClean system with the 50/50 IPA/EC7M cleaning solution at 225. The assembly can then be baked in a controlled environment at 230 for 4 hours at 71° C.

At 235, the assembly can be plasma etched to further prepare the assembly for potting. According to various embodiments, the plasma can be generated by exposing $O_2$ to an RF power of 200 Watts to about 400 Watts, at a pressure of from about 0.5 Torr to about 0.7 Torr. The plasma etching can be done for about 30 minutes. After the plasma etch is complete, the assembly can be allowed to cool.

Figure 1:
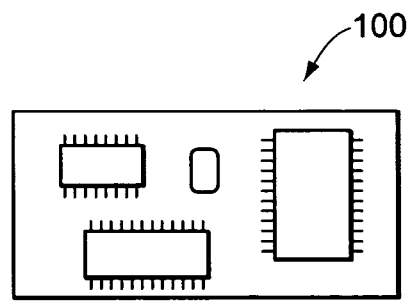
FIG. 1 depicts an example of a printed wiring board with attached electrical components according to various embodiments of the invention.
Figure 5:
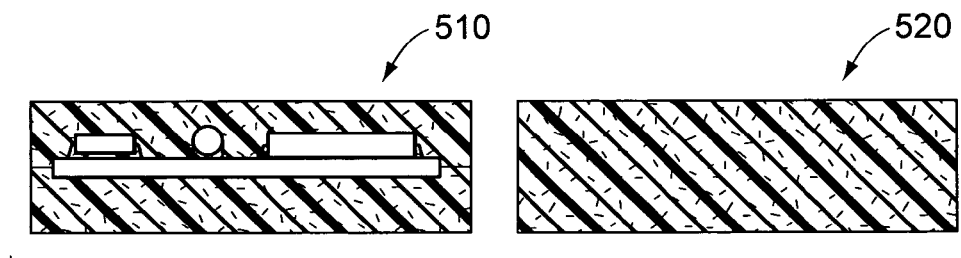
FIG. 5 depicts an exemplary encapsulated assembly and control sample according to various embodiments of the invention.

According to various embodiments, the assembly can then be prepared for priming by masking the assembly and the assembly housing at 240. Potting hardware can also be installed and masked at 240. According to various embodiments, the potting hardware can included masking that can be used to shield certain surfaces that should not be exposed to a primer solvent while at the same time allowing the primer solvent to completely cover other components. FIG. 5 depicts an example of an assembly having installed potting hardware. Exemplary potting hardware can include a stabilizing device used to insure proper mechanical alignment of internal mechanical hardware of the assembly in the assembly housing, during and after pouring a potting mixture.

The assembly can then be primed, at 245, by exposure to a primer solvent. The primer solvent can be selected based upon the adhesion requirements for the encapsulation. One primer solvent is GE SP4004P that can achieve maximized adhesion when used with GE RTV560 methyl phenyl room temperature vulcanization silicone. The primer solvent can be poured onto the assembly housing until all of the assembly and its components are completely submersed. Exposure time to the primer solvent can vary as desired. The primer solvent can then be discarded. At 250, the assembly can be placed into a controlled environment and cured for about 1 hour±0.25 hours. The temperature can be +23° C.±5° C. and the relative humidity can be 50%±5%. After the assembly is removed from the controlled environment, encapsultion of the assembly can begin within 15 minutes. At the same time that the assembly is encapsulated, control samples, as further described below, can also be produced.

According to various embodiments, a potting mixture can be prepared for use as the encapsulating material. Exemplary potting mixtures can comprise a methyl phenyl room temperature vulcanization silicone (RTV) and a curing agent. For example, GE RTV560 can be used as the methyl phenyl RTV. Further, a dibutyl tin dilaurate (DBT) can be used as the curing agent. At 251, the methyl phenyl RTV and the curing agent can be measured. A quantity of methyl phenyl RTV can be measured to pot the assembly and pour the control sample. According to various embodiments, the control samples must be about the same thickness as the assembly. For example, if GE RTV560 is used as the encapsulating material and if the assembly is a large unit, measuring about 4"×6"×2½", approximately 1400 grams of GE RTV560 can be used. According to various embodiments, the amount of curing agent can be measured at 0.3%±0.01 gram by weight.

After determining a sufficient amount of methyl phenyl RTV, an amount of the curing agent can be measured. For example, if GE RTV560 is used as the methyl phenyl RTV and a DBT is used as the curing agent, the DBT can be measured at 0.3% by weight of the measured amount of GE RTV560. This ratio of DBT can provide 40 to 50 minutes of pour time after mixing, while also providing a Shore A hardness on the bottom of an encapsulated and cured assembly of more than about 45 and a Shore A difference between the top and the bottom of less than about 10. According to various embodiments, the amount of curing agent can be measured at 0.3%±0.01 gram by weight. At this Shore A hardness, the cured assembly can have the desired dielectric properties needed for proper encapsulation. According to various embodiments, the cured assembly can have a dielectric strength from about 500 Volts per mil to about 540 Volts per mil (where 1 mil=0.001 inches). The measured amounts of methyl phenyl RTV and the curing agent can then be mixed in a container, at 253. An exemplary method of mixing comprises using an air power drill to mix for about 4 minutes and the air pressure can be set at 20 PSI.

Figure 4:
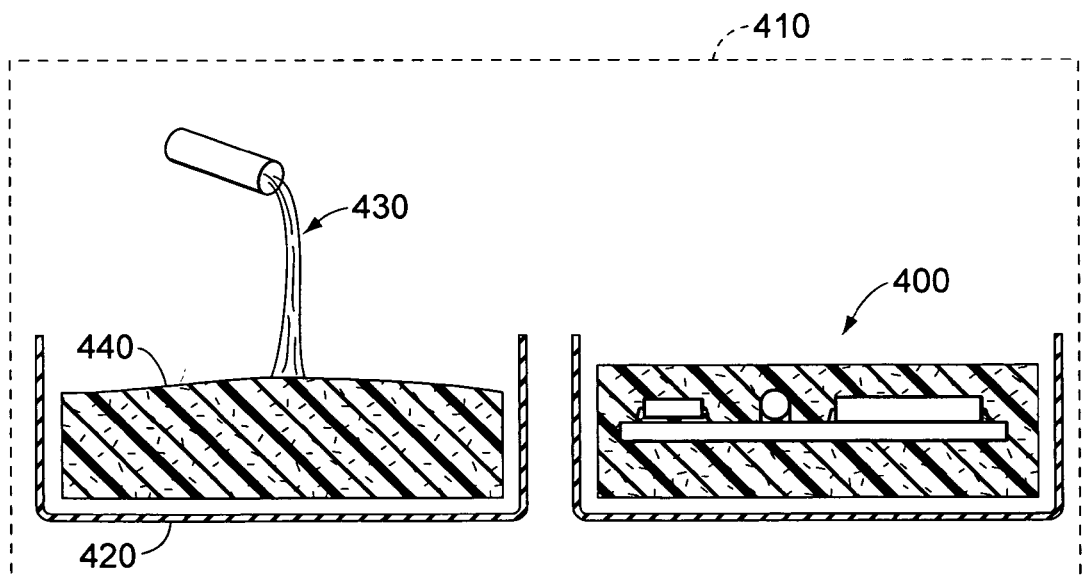
FIG. 4 depicts an exemplary vacuum chamber for use in encapsulating an assembly according to various embodiments of the invention.

According to various embodiments, at 255 the potting mixture, the assembly, and containers for two control samples can be loaded into a vacuum chamber. For example, as shown in FIG. 4, assembly 400 can be loaded into vacuum chamber 410. Containers 420 for the control samples can also be loaded into the vacuum chamber 410 as well as the potting mixture 430.

According to various embodiments, the vacuum chamber 410 can be a two-chamber system that allows de-airing of the potting mixture in the mixing container and subsequent de-airing while pouring the potting mixture onto the assembly under vacuum conditions. De-airing is a process where voids and air bubbles can be removed from the potting mixture through the use of a vacuum. The vacuum chamber can be set to establish a pressure from about 3 mm of mercury (Hg) to about 15 mm of Hg. According to some embodiments, the pressure can be set to about 10 mm of Hg which can be sufficient to remove substantially all of the voids and air bubbles from the potting material. If the voids and air bubbles are not sufficiently removed from the potting mixture, the dielectric strength of the cured potting mixture can be diminished. For example, when encapsulating a High Voltage Power Supply assembly the presence of voids and air bubbles can cause corona and subsequent failure. Initially, the potting mixture can be poured at a pouring rate determined by the design of the vacuum system and gravity onto the assembly until the assembly is 50% submersed. Subsequently, a slower pour rate can be used. For example, if a GE RTV560 mixture is being utilized, the pour can continue at a rate where the potting mixture completely submerses the assembly after about 20 to 24 minutes. The control samples 440 can then be poured. The encapsulated assembly 400 and the control samples 440 can continue to de-air in the vacuum chamber 410 for about 35 minutes to insure that substantially all voids and air bubbles have been removed from the encapsulated assembly and the control samples.

According to certain embodiments, the vacuum chamber can have two chambers, such as a top chamber and a bottom chamber. In this case, the potting mixture can be loaded into the top chamber and the assembly and the container for the control samples can be loaded into the bottom chamber. The top chamber can be evacuated to a pressure from about 5.0 mm of Hg to about 10.0 mm Hg for about 1 min. The bottom chamber can be evacuated to a pressure of about 5.0 mm of Hg. The potting mixture can be poured from the top chamber to the bottom chamber so as to completely submerse the assembly and form the control samples. The potting mixture can be poured while maintaining a vacuum in both chambers. After about half of the assembly is submersed, the second half can be submersed at a different pour rate. For example, after submersing the first half of the assembly, the second half can be submersed in about 7 to 10 min. According to various embodiments, the control samples can be made approximately the same thickness as the assembly.

When encapsulating and de-airing are complete, at 260, the encapsulated assembly 510 and control samples 520, depicted in FIG. 5, can be moved to a controlled curing environment to cure. According to various embodiments, the controlled curing environment can comprise a temperature of +23° C.±5° C. and a relative humidity of 50%±5%. In an exemplary embodiment, such as if a GE RTV560 mixture is being used, the potted assembly and the control samples can remain in the controlled curing environment for about 168 hours. Subsequently, the control samples can be tested for hardness. An exemplary hardness test is Shore A hardness testing. The hardness testing on the control samples indicate the hardness of the encapsulated assembly. The hardness test results of control samples can also indicate the dielectric strength of the cured silicone compound, since a relationship exists between hardness and dielectric strength.

According to various embodiments, the results of the hardness test on the first control sample, at 263, can be used to determine if additional exposure to the controlled curing environment is necessary. When the Shore A hardness on the bottom of the first control sample is more than about 45 and the Shore A difference between the top and the bottom is less than about 10, the encapsulated assembly can be removed from the controlled curing environment. If these test results have not yet been realized, the encapsulated assembly and the second control sample can be further exposed to the controlled curing environment. Subsequently, testing on the second control sample can be conducted to determine if the desired hardness results have been obtained.

After the desired hardness results are obtained, at 265, the encapsulated assembly can be further baked in a controlled environment, such as a temperature from about 70° C. to about 75° C. for about 20 hours±4 hours. Subsequently, the encapsulated assembly can be removed from the controlled environment and allowed to cool to room temperature.

At 270, the unit, comprising the cured encapsulated assembly and the assembly housing, can be cleaned and prepared for final testing. Any primer residue remaining on the unit can be removed with a cleaning solvent such as an isopropyl alcohol. A DAG coating can then be applied to the unit. The DAG coating is a conductive paint that functions as a ground plane to insure that the internal high voltage gradients within the encapsulated assembly distribute the high voltage as intended. The unit can then be marked and humisealed. The humiseal application is a conformal coating applied to the outside of the unit to physically protect the marking and the DAG coating from mechanical wear and tear. Subsequently, final testing of the assembly can be completed, at 275, thus completing the entire process at 280.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for encapsulating an assembly with a silicone rubber compound, the method comprising:
    exposing the assembly to a solvent;
    plasma etching the assembly;
    priming the etched assembly
    producing a potting mixture, wherein the potting mixture comprises a methyl phenyl room temperature vulcanization silicone and a curing agent;
    pouring the potting mixture over the assembly while under a vacuum until the assembly is encapsulated;
    pouring a plurality of control samples of the potting mixture while under the vacuum;
    curing the encapsulated assembly and the first control sample in a first environment and monitoring the control sample for hardness; and
    determining whether additional cure time in the first environment is needed based upon the results of the first control sample hardness tests.

2. The method of encapsulating an assembly with a silicone rubber compound according to claim 1, further comprising:
    cleaning the assembly with a solvent and baking the cleaned assembly in a second environment prior to pouring the potting mixture.

3. The method of encapsulating an assembly with a silicone rubber compound according to claim 2, further comprising:
    curing the encapsulated assembly at room temperature after baking in the first environment.

4. The method of encapsulating an assembly with a silicone rubber compound according to claim 1, wherein the step of plasma etching further comprises a plasma generated by exposing $O_2$ to an RF power of from about 200 Watts to about 400 Watts, at a pressure of from about 0.5 Torr to about 0.7 Torr, and wherein the plasma etching is done for about 30 minutes.

5. The method of encapsulating an assembly with a silicone rubber compound according to claim 1, wherein pouring of the potting mixture takes from about 40 minutes to about 50 minutes.

6. The method of encapsulating an assembly with a silicone rubber compound according to claim 1, wherein a smallest dimension of the assembly is greater than about 2.5 inches.

7. The method of encapsulating an assembly with a silicone rubber compound according to claim 1, wherein the curing agent is less than about 0.3% by weight of the potting mixture.

8. A method for encapsulating an assembly with a silicone rubber compound, the method comprising:
    cleaning an assembly in a solvent;
    plasma etching the assembly with an oxygen plasma;
    exposing the assembly to a primer solvent;
    producing a potting mixture, wherein the potting mixture comprises a methyl phenyl room temperature vulcanization silicone and a curing agent;
    pouring the potting mixture over the assembly while under a vacuum having an absolute pressure from about 3 mm of mercury to about 15 mm of mercury;
    curing the encapsulated assembly in a first environment and;
    baking the encapsulated assembly.

9. The method of encapsulating an assembly with a silicone rubber compound according to claim 8 further comprising:
    baking the assembly from about 30 minutes to about 90 minutes in a second environment prior to pouring the potting mixture, wherein the second environment comprises a temperature of 23° C.±5° C. and a relative humidity of 50%±5%.

10. The method of encapsulating an assembly with a silicone rubber compound according to claim 8 wherein the step of pouring the potting mixture further comprises:
    pouring the potting mixture over the assembly until the assembly is about 50% submersed; and
    pouring the potting mixture over a remaining portion of the assembly at a rate such that the remaining portion of the assembly is covered from about 20 minutes to about 24 minutes.

11. The method of encapsulating an assembly with a silicone rubber compound according to claim 8, wherein the potting mixture comprises a 0.3%±0.01 gram curing agent by weight.

12. The method of encapsulating an assembly with a silicone rubber compound according to claim 8, wherein the encapsulated assembly and control samples de-air in the vacuum chamber for about 35 minutes.

13. The method of encapsulating an assembly with a silicone rubber compound according to claim 8, wherein the step of pouring the potting mixture further comprises pouring a first and a second control sample of the potting mixture.

14. The method of encapsulating an assembly with a silicone rubber compound according to claim 13, wherein the step of baking the encapsulated assembly in the first environment further comprises:
    baking the control sample in the first environment, wherein the assembly and the control samples are baked for 168 hours±8 hours, and wherein the first environment comprises a temperature of 23° C.±5° C. and a relative humidity of 50%±5%.

15. The method of encapsulating an assembly with a silicone rubber compound according to claim 13, further comprising:

testing the Shore A hardness of the first control sample during the step of curing;

determining an additional cure time in the first environment if it is determined that a Shore A hardness of a bottom portion of the control sample is not at least 45 and the Shore A hardness of a top portion of the control sample differs from the Shore A hardness of the bottom portion by more than about 10.

16. An encapsulated assembly made according to the method comprising:

cleaning an assembly in a solvent;

plasma etching the assembly with an oxygen plasma;

exposing the assembly to a primer solvent;

producing a potting mixture, wherein the potting mixture comprises a methyl phenyl room temperature vulcanization silicone and a curing agent;

pouring the potting mixture over the assembly while under a vacuum having an absolute pressure from about 3 mm of mercury to about 15 mm of mercury;

curing the encapsulated assembly in a first environment; and baking the encapsulated assembly.

17. The encapsulated assembly made according to the method of claim 16, wherein the potting mixture comprises a maximum of 0.3% curing agent by weight.

18. The encapsulated assembly made according to the method of claim 16, wherein the step of pouring the potting mixture further comprises pouring a control sample of the potting mixture.

19. The encapsulated assembly made according to the method of claim 18, the method further comprising:

testing the Shore A hardness of the first control sample during the step of curing;

determining an additional cure time in the first environment if it is determined that a Shore A hardness of a bottom portion of the control sample is not at least 45 and the Shore A hardness of a top portion of the control sample differs from the Shore A hardness of the bottom portion by more than about 10.

20. The encapsulated assembly made according to the method of claim 16, wherein a smallest dimension of the assembly is greater than about 2.5 inches.

\* \* \* \* \*